US012687776B2

(12) United States Patent
Raley et al.

(10) Patent No.: US 12,687,776 B2
(45) Date of Patent: Jul. 21, 2026

(54) OPTICAL ELEMENTS PATTERNING

(71) Applicant: TEL Manufacturing and Engineering of America, Inc., Chaska, MN (US)

(72) Inventors: Angelique Raley, Albany, NY (US); Luis Fernandez, North Chelmsford, MA (US); Brian Pfeifer, Hopewell Junction, NY (US); Joshua Larose, Albany, NY (US)

(73) Assignee: TEL Manufacturing and Engineering of America, Inc., Chaska, MN (US)

( * ) Notice: Subject to any disclaimer, the term of this patent is extended or adjusted under 35 U.S.C. 154(b) by 504 days.

(21) Appl. No.: 18/305,978

(22) Filed: Apr. 24, 2023

(65) Prior Publication Data

US 2024/0353751 A1      Oct. 24, 2024

(51) Int. Cl.
| | |
|---|---|
| *G03F 1/78* | (2012.01) |
| *G03F 1/80* | (2012.01) |
| *G03F 7/16* | (2006.01) |
| *G03F 7/20* | (2006.01) |

(52) U.S. Cl.
CPC .................. *G03F 1/78* (2013.01); *G03F 1/80* (2013.01); *G03F 7/16* (2013.01); *G03F 7/20* (2013.01)

(58) Field of Classification Search
None
See application file for complete search history.

(56) References Cited

U.S. PATENT DOCUMENTS

| | | | |
|---|---|---|---|
| 6,737,643 B2 | 5/2004 | Torti et al. | |
| 8,097,860 B2 | 1/2012 | Tabat et al. | |
| 10,302,826 B1 | 5/2019 | Meyer Timmerman Thijssen et al. | |
| 10,690,821 B1 | 6/2020 | Evans et al. | |
| 10,823,888 B1 | 11/2020 | Evans et al. | |
| 11,327,218 B2 | 5/2022 | Young et al. | |
| 11,367,589 B2 | 6/2022 | Olson et al. | |
| 11,372,149 B2 | 6/2022 | Meyer Timmerman Thijssen et al. | |
| 11,380,578 B2 | 7/2022 | Meyer Timmerman Thijssen et al. | |
| 11,456,205 B2 * | 9/2022 | Evans .............. | B29D 11/00769 |
| 11,480,724 B2 | 10/2022 | Evans et al. | |
| 2010/0193708 A1 | 8/2010 | Tabat et al. | |
| 2016/0322266 A1 * | 11/2016 | Russell ............. | H01L 21/28079 |
| 2017/0338114 A1 * | 11/2017 | Choi ................... | H01L 21/0337 |

(Continued)

OTHER PUBLICATIONS

International Search Report and Written Opinion, PCT/US2024/017975, mailed Jun. 21, 2024, Total pp. 12.

(Continued)

*Primary Examiner* — Shamim Ahmed
(74) *Attorney, Agent, or Firm* — Slater Matsil, LLP

(57) ABSTRACT

A method for processing a substrate with a gas cluster ion beam (GCIB) that includes: receiving, at a GCIB controller, control signals from a tool controller to change a GCIB process parameter during a GCIB scanning process, the changing in the GCIB process parameter associated with a variation in the depth of recesses to be formed over the substrate with the GCIB scanning process; and performing the GCIB scanning process in a GCIB process chamber, the performing including scanning a GCIB across a portion of the substrate according to the control signals to form the recesses with varying depths, the variation in the depth of the recesses having a gradient associated with the change in the GCIB process parameter.

20 Claims, 11 Drawing Sheets

(56)     References Cited

U.S. PATENT DOCUMENTS

| | | | |
|---|---|---|---|
| 2018/0292745 A1* | 10/2018 | Kirkpatrick ....... | H01L 21/26513 |
| 2020/0033530 A1 | 1/2020 | Colburn et al. | |
| 2020/0192009 A1 | 6/2020 | Evans et al. | |
| 2021/0305055 A1 | 9/2021 | Godet et al. | |
| 2021/0351069 A1 | 11/2021 | Evans et al. | |
| 2022/0152724 A1 | 5/2022 | Luo et al. | |
| 2022/0276498 A1 | 9/2022 | Godet et al. | |
| 2022/0359155 A1 | 11/2022 | Gwinn et al. | |
| 2022/0392771 A1 | 12/2022 | Ko | |
| 2023/0033741 A1 | 2/2023 | Roy et al. | |

OTHER PUBLICATIONS

Engelberg et al., "The advantages of metalenses over diffractive lenses," Nature Communications, https://doi.org/10.1038/s41467-020-15972-9, Apr. 24, 2020, 4 pages.
Yamada, "Historical milestones and future prospects of cluster ion beam technology," Applied Surface Science (2014), http://dx.doi.org/10.1016/j.apsusc.2014.03.147, Mar. 24, 2014, 48 pages.
Xiong et al., "Augmented reality and virtual reality displays: emerging technologies and future perspectives," Light: Science & Applications, https://doi.org/10.1038/s41377-021-00658-8, Oct. 25, 2021, 30 pages.
Yamada et al., "Materials processing by gas cluster ion beams," Materials Science and Engineering R, vol. 34, pp. 231-295, May 30, 2001, 65 pages.

* cited by examiner

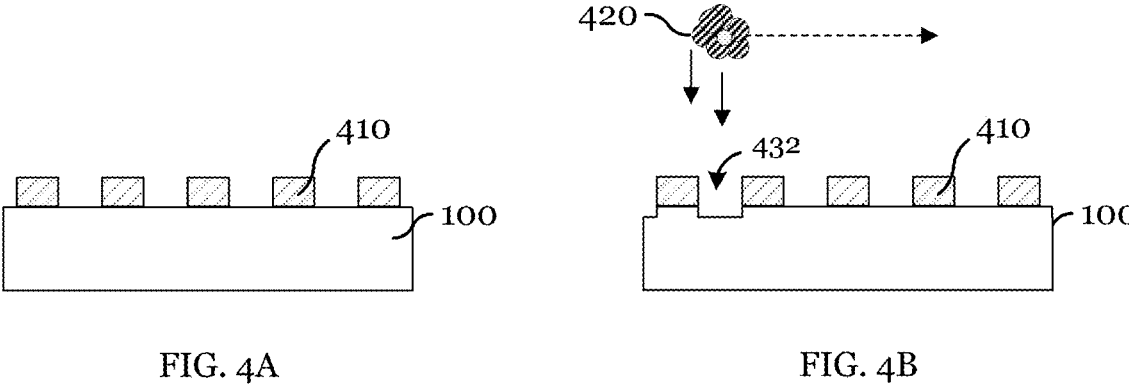
FIG. 4A                                          FIG. 4B
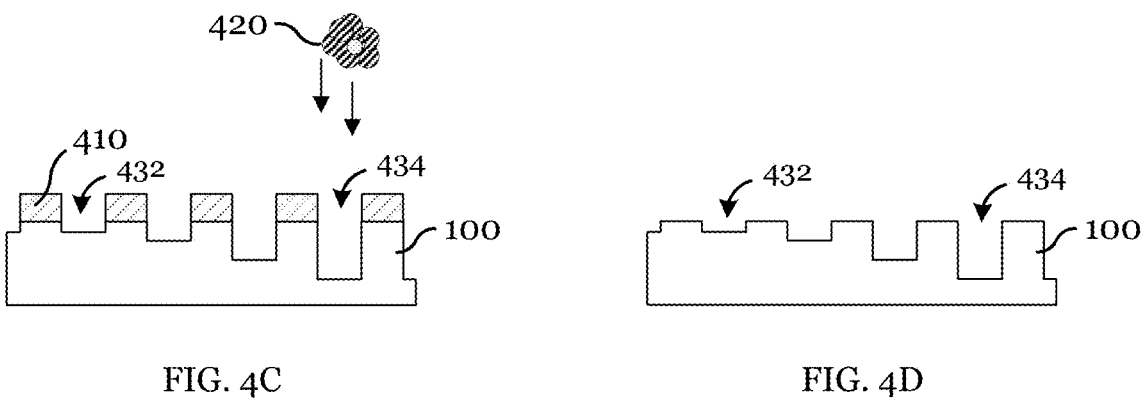
FIG. 4C                                          FIG. 4D

70

ETCH PORTION OF SUBSTRATE TO FORM RECESSES BY SCANNING SUBSTRATE COMPRISING PATTERNED FIRST MASK LAYER OVER SUBSTRATE UNDER GAS CLUSTER ION BEAM (GCIB)

710

WHILE SCANNING, DYNAMICALLY ADJUST GCIB PARAMETER TO TUNE ETCHING SUCH THAT RECESSES HAVE DEPTH GRADIENT ACROSS PORTION OF SUBSTRATE

720

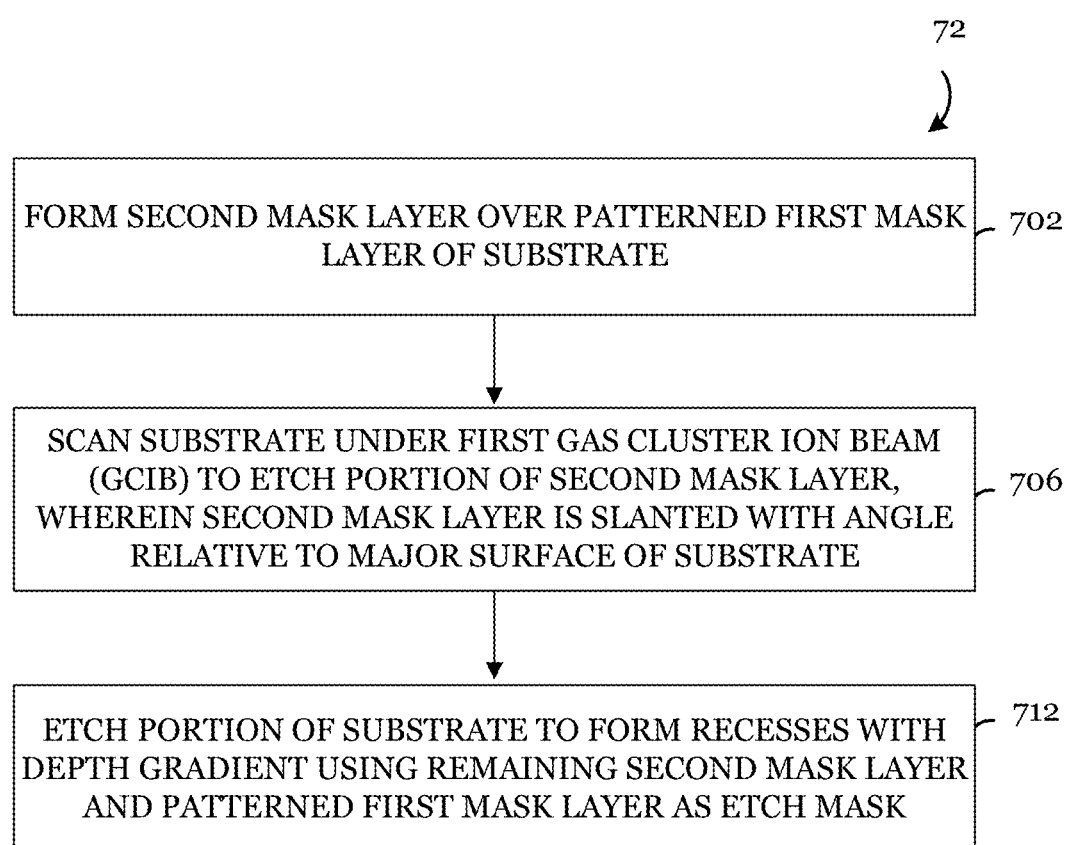

72

FORM SECOND MASK LAYER OVER PATTERNED FIRST MASK LAYER OF SUBSTRATE — 702

SCAN SUBSTRATE UNDER FIRST GAS CLUSTER ION BEAM (GCIB) TO ETCH PORTION OF SECOND MASK LAYER, WHEREIN SECOND MASK LAYER IS SLANTED WITH ANGLE RELATIVE TO MAJOR SURFACE OF SUBSTRATE — 706

ETCH PORTION OF SUBSTRATE TO FORM RECESSES WITH DEPTH GRADIENT USING REMAINING SECOND MASK LAYER AND PATTERNED FIRST MASK LAYER AS ETCH MASK — 712

FIG. 7B

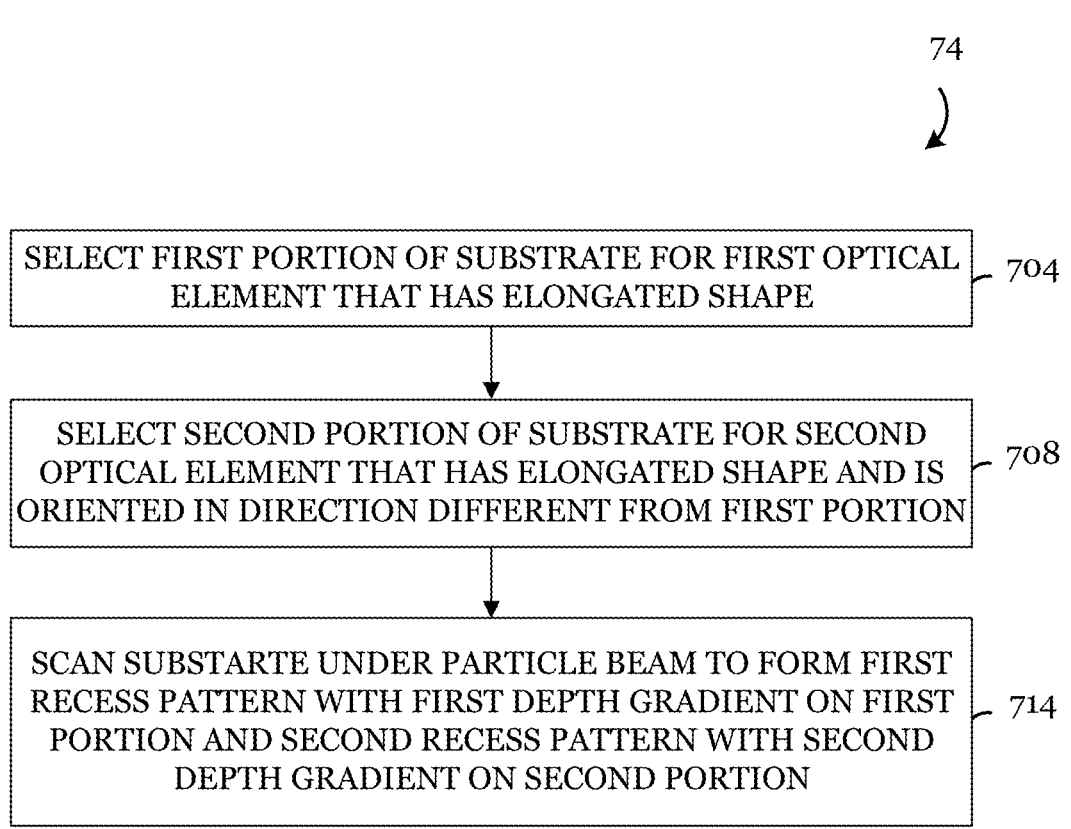

74

| |
|---|
| SELECT FIRST PORTION OF SUBSTRATE FOR FIRST OPTICAL ELEMENT THAT HAS ELONGATED SHAPE |

704

| |
|---|
| SELECT SECOND PORTION OF SUBSTRATE FOR SECOND OPTICAL ELEMENT THAT HAS ELONGATED SHAPE AND IS ORIENTED IN DIRECTION DIFFERENT FROM FIRST PORTION |

708

| |
|---|
| SCAN SUBSTARTE UNDER PARTICLE BEAM TO FORM FIRST RECESS PATTERN WITH FIRST DEPTH GRADIENT ON FIRST PORTION AND SECOND RECESS PATTERN WITH SECOND DEPTH GRADIENT ON SECOND PORTION |

OPTICAL ELEMENTS PATTERNING

TECHNICAL FIELD

The present invention relates generally to methods of processing a substrate, and, in particular embodiments, to optical elements patterning.

BACKGROUND

Surface relief gratings (SRGs) are periodic structures on the surface of a material that control the diffraction of light. These structures may comprise ridges and grooves with a periodicity that is typically on the order of the wavelength of light. SRGs are of significant interest for use in virtual and augmented reality (VR/AR) displays, where they can be used as optical waveguide. SRGs can also be used in other applications such as spectrometers, beam splitters, 3D scanning systems, and diffractive lenses. Further, SRGs with depth gradients can be particularly useful for a variety of optical applications. For example, by introducing a gradient in the grating height, it is possible to create a refractive index gradient. This has been used in the design of micro-lenses, optical waveguides, and beam shapers, including such optical elements for VR/AR displays.

The design and fabrication of SRGs are critical for achieving the desired performance, and various manufacturing techniques are available, including UV photolithography and nanoimprint lithography. However, fabrication of SRGs is still faced with technical challenges such as the need for high precision and the high cost of manufacturing. Therefore, it is desired to develop a new method of fabrication for SRGs and improve the process accuracy and efficiency.

SUMMARY

In accordance with an embodiment of the present invention, a method for processing a substrate with a gas cluster ion beam (GCIB) that includes: receiving, at a GCIB controller, control signals from a tool controller to change a GCIB process parameter during a GCIB scanning process, the changing in the GCIB process parameter associated with a variation in the depth of recesses to be formed over the substrate with the GCIB scanning process; and performing the GCIB scanning process in a GCIB process chamber, the performing including scanning a GCIB across a portion of the substrate according to the control signals to form the recesses with varying depths, the variation in the depth of the recesses having a gradient associated with the change in the GCIB process parameter.

In accordance with an embodiment of the present invention, a method for processing a substrate with a gas cluster ion beam (GCIB) that includes: patterning a first mask layer disposed over the substrate; forming a second mask layer over the patterned first mask layer of the substrate; and etching a portion of the second mask layer such that a remaining surface of the portion of the second mask layer is slanted with a slope relative to a major surface of the substrate, the etching including, receiving, at a GCIB controller, control signals from a tool controller to change a GCIB process parameter during etching the portion of the second mask layer, the changing in the GCIB process parameter associated with the slope, and scanning a first GCIB across a portion of the substrate according to the control signals.

In accordance with an embodiment of the present invention, a method of fabricating a plurality of optical elements from a substrate that includes: selecting a first portion of the substrate for a first optical element to be formed that has an elongated shape along a first direction; selecting a second portion of the substrate for a second optical element to be formed that has the elongated shape along a second direction different from the first direction; and scanning the substrate with a particle beam to form a first recess pattern with varying depth on the first portion of the substrate and a second recess pattern with varying depth on the second portion of the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3C illustrate different scanning patterns for scanning an optical element in accordance with various embodiments, wherein FIG. 3A illustrates a horizontal two-way scanning, FIG. 3B illustrates a horizontal one-way scanning, and FIG. 3C illustrates an oblique one-way scanning;

FIGS. 4A-4D illustrate partial cross-sectional views of an example substrate at various stages of fabricating an optical element in accordance with various embodiments, wherein FIG. 4A illustrates an incoming substrate with a patterned first mask layer, FIG. 4B illustrates the substrate at the beginning of a scan for a gas cluster ion beam (GCIB) process to form a recess pattern in the substrate, FIG. 4C illustrates the substrate at the end of the scan of the GCIB process, and FIG. 4D illustrates the substrate after the GCIB process and removing the patterned first mask layer;

FIGS. 5A-5C illustrate partial cross-sectional views of an example substrate at various stages of fabricating an optical element in accordance with alternate embodiments, wherein FIG. 5A illustrates an incoming substrate with a patterned first mask layer and a second mask layer, FIG. 5B illustrates the substrate after a scan for a gas cluster ion beam (GCIB) process to form a slanted surface of the second mask layer, and FIG. 5C illustrates the substrate after a subsequent etch process to form a recess pattern in the substrate;

FIGS. 6A and 6B illustrate partial cross-sectional views of an example optical element with surface relief gratings (SRGs), wherein FIG. 6A illustrates the optical element with slanted gratings, and FIG. 6B illustrates the optical element with slanted and tapered gratings;

FIGS. 7A-7C illustrate process flow charts of methods of optical elements patterning in accordance with various embodiments, wherein FIG. 7A illustrates an embodiment, FIG. 7B illustrates another embodiment, and FIG. 7C illustrates yet another embodiment;

DETAILED DESCRIPTION OF ILLUSTRATIVE EMBODIMENTS

This application relates to methods of processing a substrate, more particularly to optical elements patterning. For optical elements used for virtual and augmented reality (VR/AR) displays, it is important to have "see-through" capability where a user can view both a virtual image projected on the display and the real world environment at the same time. To guide light in a desired direction, optical waveguides are thus essential for the VR/AR display optical elements. Optical waveguides may be formed using surface relief gratings (SRGs) that have periodic ridges and grooves on the order of the wavelength of light. In particular, SRGs with depth gradients may be used to enable refractive index gradient that is useful in out-coupling light from the waveguide. Although SRGs may be fabricated on a substrate using a photolithography and a subsequent etch process, fabricating complex SRGs such as those with depth gradients may require more complex process flows (e.g., multiple mask layers) and precise process control. Therefore, a new method for fabricating SRGs may be desired. Embodiments of the present application disclose methods of gas cluster ion beam (GCIB) process for patterning optical elements with SRGs.

The methods described in this disclosure may advantageously improve the process of fabricating SRGs for optical elements by providing the ability of location specific depth correction. Taking advantage of the precise trimming control capability, the methods may enable SRGs with depth gradient in selected areas of a substrate. Further, it is also possible to fabricate optical elements oriented in different directions from a single substrate. The methods of GCIB process may advantageously be applied to various patterning process flows such as a multi-mask patterning approach, a single-mask patterning approach, or even a mask-less approach.

In the following, packing of multiple optical elements to be formed on a substrate and an example eyewear comprising the optical elements are first described referring to FIGS. 1-2. Example scanning patterns for an optical element by gas cluster ion beam (GCIB) is then described referring to FIG. 3A-3C in accordance with various embodiments. With FIGS. 4A-4D, 5A-5C, and 6A-6B, steps of the GCIB process for the optical element are described in accordance with various embodiments, followed by example process flow diagrams illustrated in FIGS. 7A-7C. FIG. 8 provides an example GCIB processing system for optical elements patterning. All figures in this disclosure are drawn for illustration purpose only and not to scale, including the aspect ratios of features. Although the description below in this disclosure is mainly for surface relief gratings (SRGs) for optical elements using a GCIB process, the methods herein may also be applied to any other fabrication processes where patterning a recess pattern with depth gradients may be useful.

Figure 1:
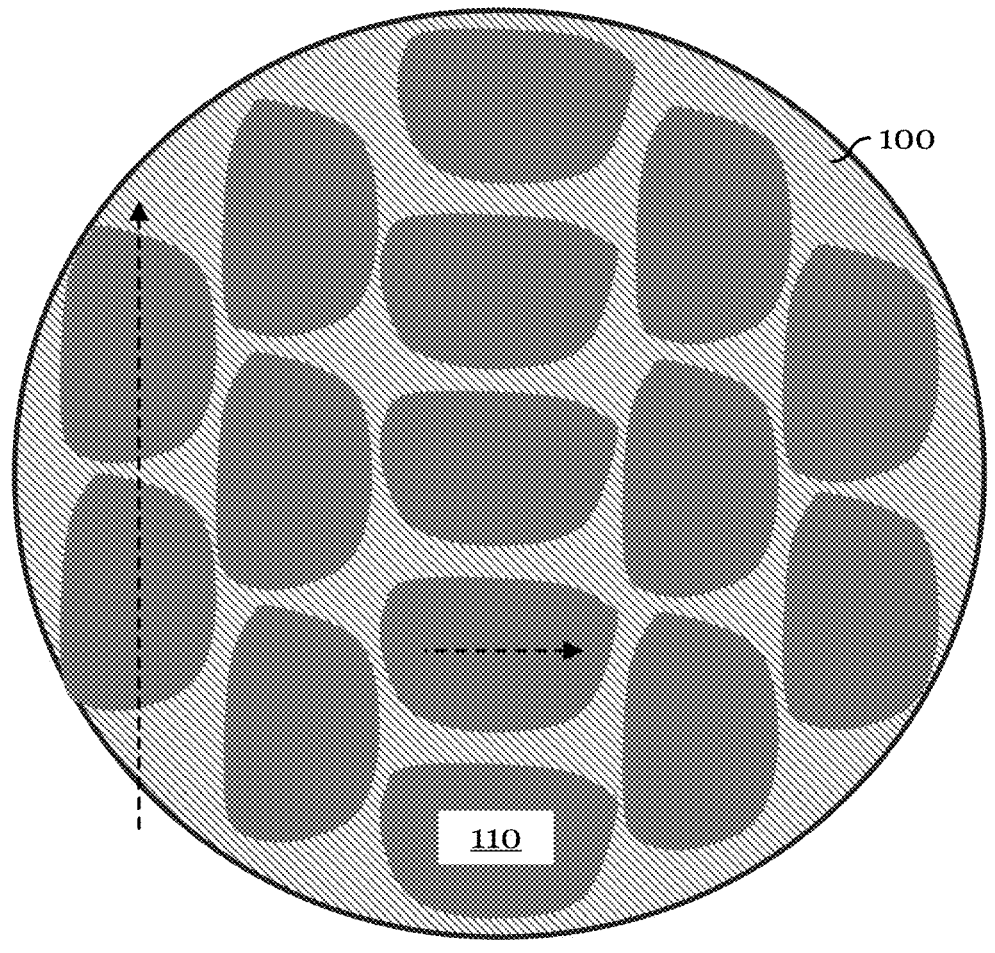
FIG. 1 illustrates an example substrate comprising areas selected for optical elements to be formed in accordance with various embodiments.

FIG. 1 illustrates an example substrate 100 comprising areas selected for optical elements 110 to be formed in accordance with various embodiments.

FIG. 1 illustrates a cross-sectional view of an incoming substrate 100. In various embodiments, the substrate 100 may be a transparent substrate such as a glass or polymer substrate. The substrate 100 may comprise a glass, silicon carbide, or other suitable materials for optical element such as optical lens. In other embodiments, the substrate to be processed may be a semiconductor wafer, ceramic substrate, a piezoelectric substrate, a flat panel display, a liquid crystal display, or any other devices or materials. Although this disclosure mainly describes optical elements patterning, in various embodiments of this disclosure, the substrate may include any material portion or structure of a device or substrate and combinations thereof, thus not limited to any particular base structure, underlying layer or overlying layer, patterned or un-patterned. In various embodiments, the substrate 100 may have a diameter of 200 mm or 300 mm that may be loaded and processed in a gas cluster ion beam (GCIB) process chamber.

As illustrated in FIG. 1, multiple optical elements 110 may be fabricated from a single substrate (i.e., the substrate 100). The optical elements 110 may have any shape suitable for their application (such as optical lens), for example, an oval or elongated round shape. In various embodiments, as indicated by two dotted arrows in FIG. 1, some of the optical elements 110 may be oriented in a direction different from others. Such an arrangement may be advantageous to maximize the number of the optical elements 110 that can be fabricated from the substrate 100. In various embodiments, the methods of GCIB process may provide the freedom of scanning direction within a substrate and the fine tuning ability for etching, and thereby each of the optical elements 110 may advantageously be positioned with any orientation.

Although FIG. 1 illustrates a total of 15 optical elements positioned in two different orientations, the number of optical elements and orientations on a substrate are not limited to any number. Further, in various embodiments, the optical elements 110 may have more than one patterning design, for example, some of the optical elements 110 may be patterned to be left-side optical lenses and others may be patterned to be right-side optical lenses. The methods may also be used to selectively process only the areas of interest on the substrate 100 with GCIB.

Figure 2:
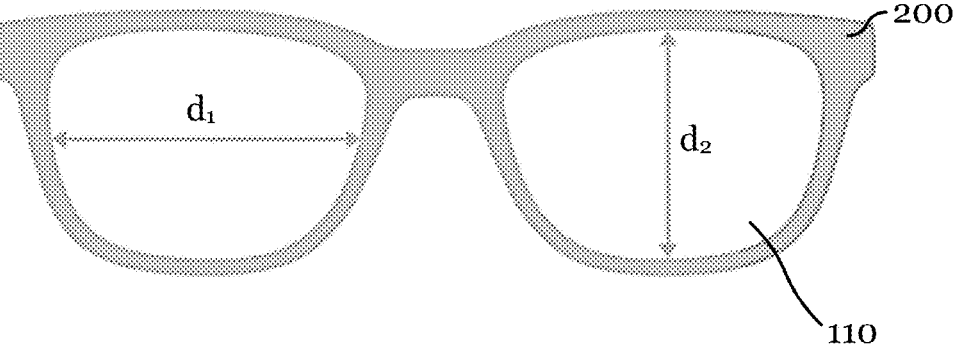
FIG. 2 illustrates an example eyewear comprising optical elements formed in accordance with various embodiments.

FIG. 2 illustrates an example eyewear 200 comprising optical elements 110 formed in accordance with various embodiments.

In various embodiments, the optical elements 110 may be optical lenses suitable for the eyewear 200. In certain embodiments, the eyewear 200 is for a virtual and augmented reality (VR/AR) display. In one or more embodiments, the eyewear 200 may have a width between 100 mm and 150 mm, for example, about 130 mm, and the optical element 110 may have a horizontal diameter ($d_1$) between 50 mm and 60 mm and a vertical diameter ($d_2$) between 40 mm and 50 mm.

Figure 3A:
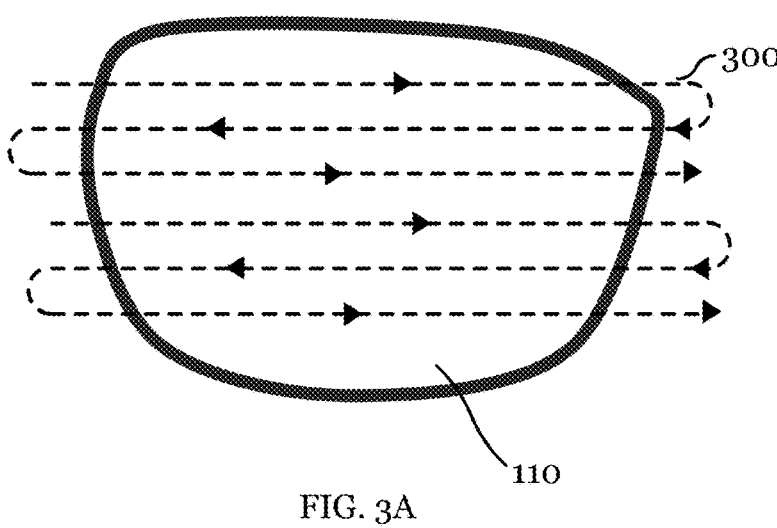
Figure 3B:
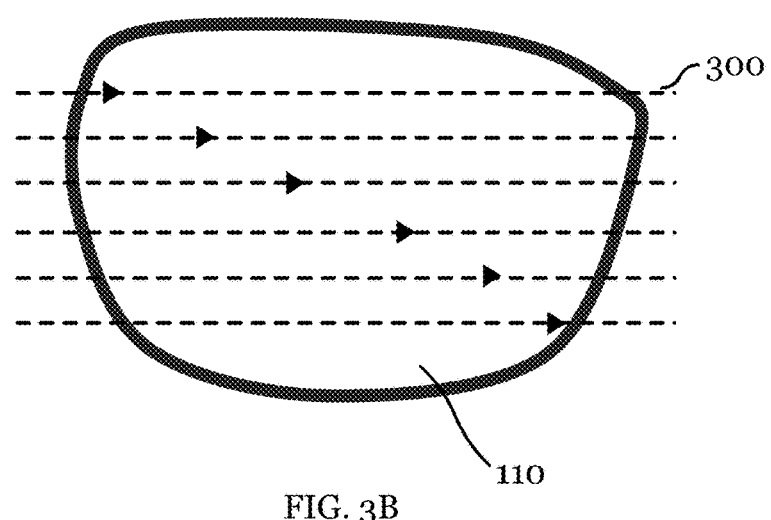
Figure 3C:
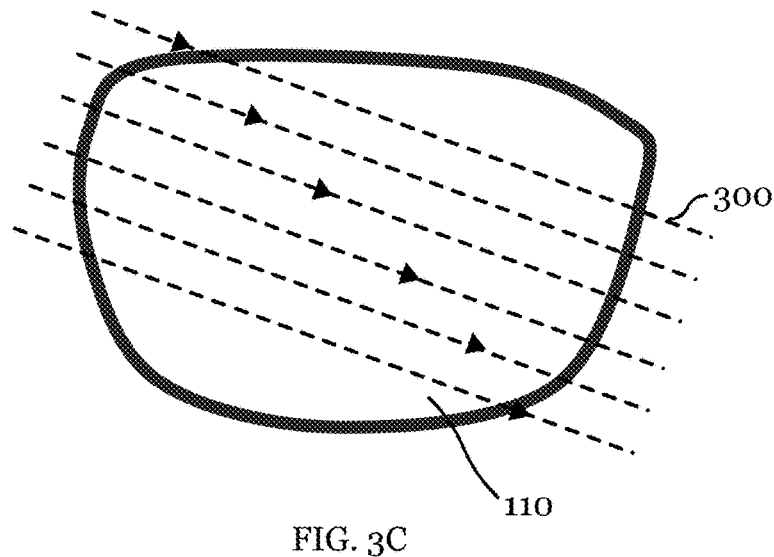

FIGS. 3A-3C illustrate different scanning patterns for scanning an optical element in accordance with various embodiments.

In various embodiments, the optical elements 110 may be patterned by scanning the substrate with a gas cluster ion beam (GCIB), for example, by moving the substrate relative to a fixed GCIB. In this disclosure, "scanning" is used to broadly refer to treat a substrate with a beam, and is not limited to any mode of scanning (e.g., moving a substrate across a fixed beam or moving a beam across a fixed substrate). In certain embodiments, the scanning may be comprising moving both the substrate and the beam. As illustrated in FIGS. 3A-3C, the scanning may be performed in various ways as indicated by a scanning direction 300. In one embodiment illustrated in FIG. 3A, the methods may scan the substrate horizontally in both directions (i.e., left to right and vice versa) while moving the scanning line stepwise from top to bottom. In another embodiment illustrated in FIG. 3B, the methods may scan the substrate horizontally in one direction (i.e., left to right) while moving the scanning line stepwise from top to bottom. In yet another embodiment illustrated in FIG. 3C, the methods may also scan the substrate in one direction but with an angle relative to the horizontal line. The methods may dynamically adjust the scanning direction and GCIB parameters (e.g., scanning speed, and incident angle) for each optical element while process the entirety of the substrate, which may advantageously enable the packing of the optical elements with varying orientation (e.g., FIG. 1).

GCIB process offer advantages in surface modification and has been used for etching, cleaning, and smoothing of the surfaces of various materials. In various embodiments of the methods, the use of GCIB for patterning optical elements may provide several advantages compared to some of the conventional methods using other etching techniques (e.g., ribbon ion beam). For example, the GCIB may be formed as a sharp point beam with a spot size down to a few microns, which in turn enables precise X-Y location specific etch control that may be difficult with a widely dispersed beam such as ribbon ion beam. In addition, GCIB may offer a better dose control (i.e., the energy of particle bombardment). In certain embodiments, the dose control of GCIB may be sufficient to enable "zero-etch" in the areas where no patterning is needed. The GCIB dose may be controlled by adjusting various GCIB process parameters such as cluster size, scanning speed, and ionization level. In one embodiment, the clusters may be fragmented into smaller clusters by Ar bombardment using a pressure cell feature of the GCIB system.

Further, GCIB may also advantageously avoid undesired damage to the substrate. When gas clusters bombard the surface, they disintegrate and deliver most of the kinetic energy toward modifying the substrate physically and/or chemically. Although each cluster has high energy (e.g., about 30 keV to 80 keV), the energy per molecule is low at around a few eV; therefore the molecules in the GCIB are generally stopped within about a few nanometers (e.g., less than 10 nm) from the surface. On the other hand, for example, a single molecule ion if present in the beam may have energies in the range of tens of keV and therefore can easily penetrate deeply into a substrate (many tens of nm to around 100 nm) and may cause uncontrolled damage to the substrate.

FIGS. 4A-4D illustrate partial cross-sectional views of an example substrate 100 at various stages of fabricating an optical element in accordance with various embodiments based on a single-mask approach. FIG. 4A illustrates an incoming substrate 100 with a patterned first mask layer 410.

In FIG. 4A, only a portion of the substrate 100 where an optical element may be formed is illustrated. In various embodiments, the entirety or a portion of the area of the optical element may be processed for patterning. In one or more embodiments, a length of a side of the area to be processed for patterning may be between 20 mm and 50 mm.

The incoming substrate such as a glass or polymer substrate may comprise the patterned first mask layer 410. The patterned first mask layer 410 may comprise any suitable mask material for etching the substrate 100, including silicon nitride, metal oxide, and metal nitride. In certain embodiments, the patterned first mask layer 410 may be formed as a layer stack comprising more than one material. In various embodiments, a blanket layer of a hard mask (e.g., silicon nitride) may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. The blanket layer may then be patterned using a lithographic process and a subsequent etch process to form the patterned first mask layer 410. The pattern of the patterned first mask layer 410 may be the relief pattern for the target surface relief gratings (SRGs) to be formed in the substrate 100. Accordingly, in various embodiments, the patterned first mask layer may have a pitch size between 100 nm and 10 μm.

FIG. 4B illustrates the substrate 100 at the beginning of a scan for a gas cluster ion beam (GCIB) process to form a recess pattern in the substrate 100.

In FIG. 4B, the GCIB process may be performed to pattern the substrate 100 by exposing the substrate 100 to a GCIB. For illustration purpose, one ionized gas cluster 420 is illustrated in FIG. 4B to represent the GCIB. The GCIB may be formed by condensing gas molecules to form gas clusters and then ionizing them. Because of the electrical charges provided to the gas clusters, ionized gas clusters can be accelerated with an electric field and directed to bombard the surface for modification (e.g., etching or smoothing).

In various embodiments, the gas used for GCIB process may comprise inert gases such as helium (He), neon (Ne), argon (Ar), krypton (Kr), xenon (Xe), and nitrogen ($N_2$), reactive gases such as $O_2$, $CO_2$, $NH_3$, $NF_3$, $SF_6$, $CF_4$, $CHF_3$, the like, or a mixture of thereof. In one embodiment, the gas comprises $O_2$ for etching the substrate 100.

At the beginning of the scan of the GCIB process, the beam spot may be positioned to etch a first portion of the substrate 100 (e.g., a first recess 432 on the left of the substrate 100 in FIG. 4B). The first recess 432 may be formed as a shallow recess compared to other recesses to be formed in a later stage of the scan. The dose at a given location of the substrate 100 may be tuned to achieve an individual target depth for each recess. Accordingly, the GCIB parameters may be adjusted as the scan proceeds for the dose control. The substrate 100 may be moved such that the scan proceeds to the direction indicated by a dotted line in FIG. 4B. The scan may proceed stepwise or continuously. After completing the first recess 432, the GCIB may be positioned to etch a next recess.

FIG. 4C illustrates the substrate 100 at the end of the scan of the GCIB process.

As illustrated in FIG. 4C, at the end of scan, a series of recesses (e.g., four recesses in FIG. 4C, with a fourth recess 434 being the deepest) may be formed with depth gradients. This series of recesses may comprise surface relief gratings (SRGs) for the VR/AR display optical element. In various embodiments, the depth of the recesses may be between 10 nm and 500 nm. As a result of dynamically adjusting the GCIB process parameters (e.g., scanning speed, ionization level) during the scan to control the dose and thereby degree of etching spatially, each recess may have a different depth as illustrated in FIG. 4C. Although each of the recesses in FIG. 4C is illustrated with a different depth that linearly increases from left to right, the depth gradients may be formed in a different fashion, for example, with some recesses with a same depth or non-linear depth gradients.

It should be noted that the steps described above referring to FIGS. 4B-4C are only for a part of a scan for a portion of the substrate 100. The scan of GCIB process may continue for a different area of the substrate 100 to complete the fabrication of the optical elements, for example, according to the scanning patterns illustrated in FIGS. 3A-3C.

FIG. 4D illustrates the substrate 100 after the GCIB process and removing the patterned first mask layer.

After completing the GCIB process, a subsequent etch may be performed to remove any remaining patterned first mask layer. In certain embodiments, an optical surface smoothing process may also be performed, for example, using another GCIB process.

In alternate embodiments, the GCIB process may be applied to pattern optical elements with a multi-mask patterning approach. The use of two mask layers can enable more options for methods for patterning. For example, as further described below referring to FIGS. 5A-5C, the second mask layer may be patterned first to have a slanted surface, followed by a subsequent etch process to pattern the substrate to form surface relief gratings (SRGs).

Figure 5A:
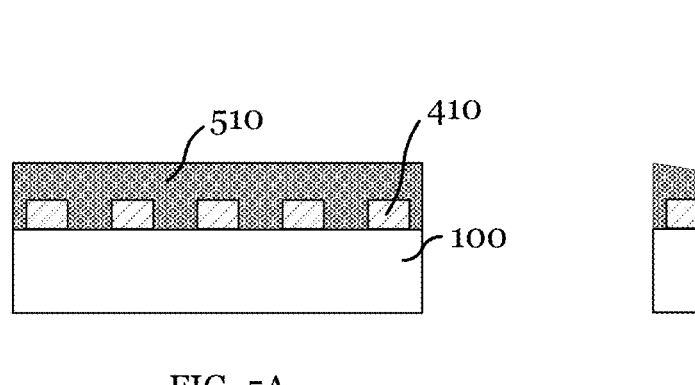
Figure 5B:
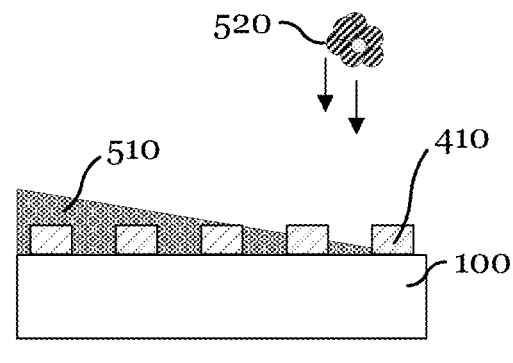
Figure 5C:
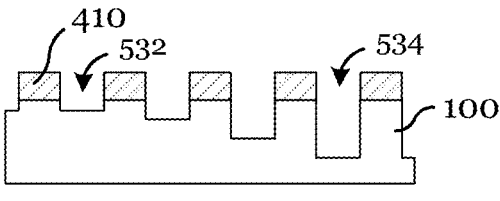

FIGS. 5A-5C illustrate partial cross-sectional views of an example substrate 100 at various stages of fabricating an optical element in accordance with alternate embodiments. FIG. 5A illustrates an incoming substrate 100 with a patterned first mask layer 410 and a second mask layer 510. The substrate 100 in FIG. 5A has a feature same as that in FIG. 4A except the second mask layer, and thus some details will not be repeated.

In FIG. 5A, the substrate 100 may comprise the second mask layer 510 formed over the patterned first mask layer 410. In various embodiments, the second mask layer 510 may comprise a mask material softer than the mask material for the patterned first mask layer 510 such that a patterning of the second mask layer may be possible without damaging the patterned first mask layer 410. In certain embodiments, such a material for the second mask layer 410 may be a photoresist. The photoresist may be deposited over the substrate 100 by an appropriate deposition technique, for example, a spin-on process, and may be developed or cured to form the second mask layer 510.

FIG. 5B illustrates the substrate 100 after a scan for a gas cluster ion beam (GCIB) process to form a slanted surface of the second mask layer 510.

In FIG. 5B, the GCIB process may be performed to pattern the second mask layer 510 first by exposing the substrate 100 to a GCIB, where the etching may be selective to the first mask layer 410 and the substrate 100. For illustration purpose, one ionized gas cluster 520 is illustrated in FIG. 5B to represent the GCIB.

In various embodiments, the gas used for GCIB process may comprise inert gases such as helium (He), neon (Ne), argon (Ar), krypton (Kr), xenon (Xe), and nitrogen ($N_2$), reactive gases such as $O_2$, $CO_2$, $NH_3$, $NF_3$, $SF_6$, $CF_4$, $CHF_3$, the like, or a mixture of thereof. In one embodiment, the gas comprises $O_2$ for etching the second mask layer 510.

The scan of the GCIB process may be tuned to enable the slanted surface of the second mask layer 510. In certain embodiments, the substrate may be tilted during the scan of the GCIB process, which may be useful in forming slanted surface. Although not wishing to be limited by any theory, tilting the substrate can affect the etch depth, angle, and area globally or locally. In one embodiment, as illustrated in FIG. 5B, the thickness of the second mask layer 510 after patterning may gradually decrease from the left to right of the substrate 100. The angle of the slanted surface relative to the major surface of the substrate 100 may be selected according to parameters such as the initial thickness of the second mask layer 510 and the width of the portion of the substrate to be processed with the GCIB.

FIG. 5C illustrates the substrate 100 after a subsequent etch process to form a recess pattern in the substrate 100.

After the GCIB process to pattern the second mask layer 510, a subsequent etch process may be performed to pattern the substrate 100 and form a series of recesses with depth gradients. For example, as illustrated in FIG. 5C, the series of recesses may comprise a shallow recess 532 and a deep recess 534, similar to the final structure illustrated in FIG. 4C with prior embodiments.

During this subsequent etch process, both the patterned first mask layer 410 and the second mask layer 510 with the slanted surface (as illustrated in FIG. 5B) function as an etch mask. The thickness gradient in the second mask layer 510 formed by the GCIB process above (FIG. 5B) may effectively result in a gradient in masking ability across the portion of the substrate 100. In other words, a uniform etching environment (e.g., plasma) may be used for the subsequent etch process, and despite the uniformity of the etching environment, a depth gradient in the series of recesses may be obtained.

Accordingly, in various embodiments with the multi-mask patterning approach, the subsequent etch process may advantageously be performed using one or more anisotropic etch processes, for example, plasma etch processes such as reactive ion etch (RIE) processes. The use of plasma etch process may advantageously reduce or eliminate the need for scanning during this step.

In other embodiments with the multi-mask patterning approach, the subsequent etch process may be another GCIB process, where a first GCIB process is for patterning the second mask layer 510 (FIG. 5B) and a second GCIB process for patterning the substrate 100 (FIG. 5C). In these embodiments, unlike the single-mask approach, thanks to the thickness gradient in the mask material, the requirement for location specific etch control during the second GCIB process may be relaxed. Therefore, the second GCIB process may be performed with a faster scan rate or a larger spot size compared to the first GCIB process. Further, in various embodiments, since the etch target is different for the two processes, the first and second GCIB processes may use different chemical compositions. For example, $O_2$-based etch chemistry may be used for one of the two processes targeting etching organic materials (e.g., carbon-based photoresist). In another embodiment, $O_2$ may be used for both processes but the $O_2$ gas flow rate may be increased or decreased when switching the processes.

The methods of GCIB process may also be applied to a mask-less approach within the pitch size feasible with a direct GCIB patterning. An incoming substrate may not comprise a mask layer and a series of recess may directly be formed as surface relief gratings (SRGs) by the GCIB process.

Figure 6A:
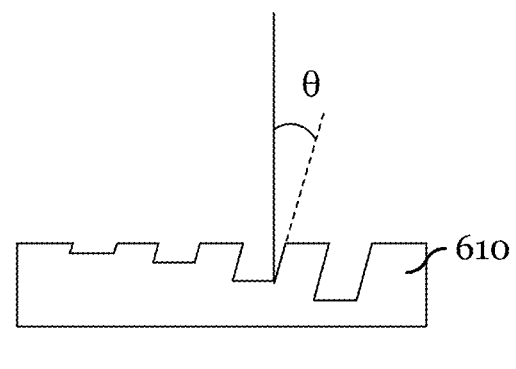
Figure 6B:
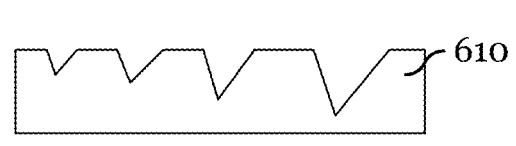

FIGS. 6A and 6B illustrate partial cross-sectional views of an example optical element 610 with surface relief gratings (SRGs).

In addition to straight vertical recesses with depth gradient (e.g., FIGS. 4D and 5C), various other types of SRGs may be enabled by the methods of GCIB process in accordance with various embodiments. In FIG. 6A, a series of recesses may be formed as slanted gratings with a slant angle θ, where θ is an angle from a plane normal to the major surface of the optical element 610. The slanted gratings may be formed by tilting the substrate during the GCIB process of the single-mask patterning approach or the subsequent etch process of the multi-mask patterning approach. In various embodiments, the substrate may be tilted prior to exposing the substrate to the GCIB such that GCIB impinges on the substrate with the slant angle θ. In certain embodiments, the slant angle θ may be between 15° and 65°. In FIG. 6B, a series of recesses may be formed as slanted and tapered gratings, where the each recess shrinks in critical dimension (CD) toward the bottom. For certain applications of SRGs in optical elements, structures with slanted gratings, tapered gratings, or both may be particularly useful.

Figure 7A:
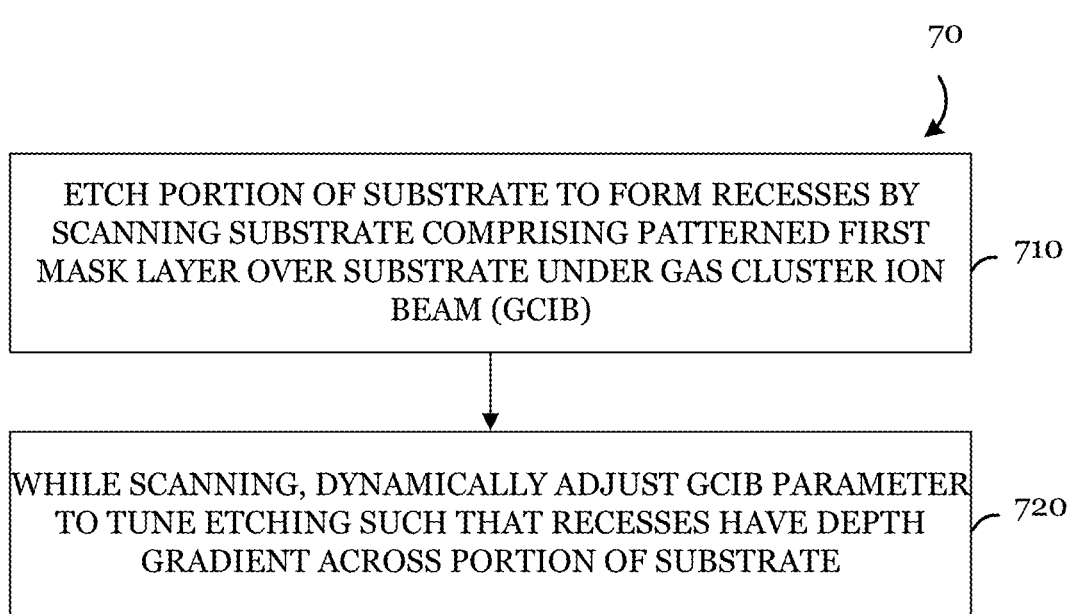
Figure 8:
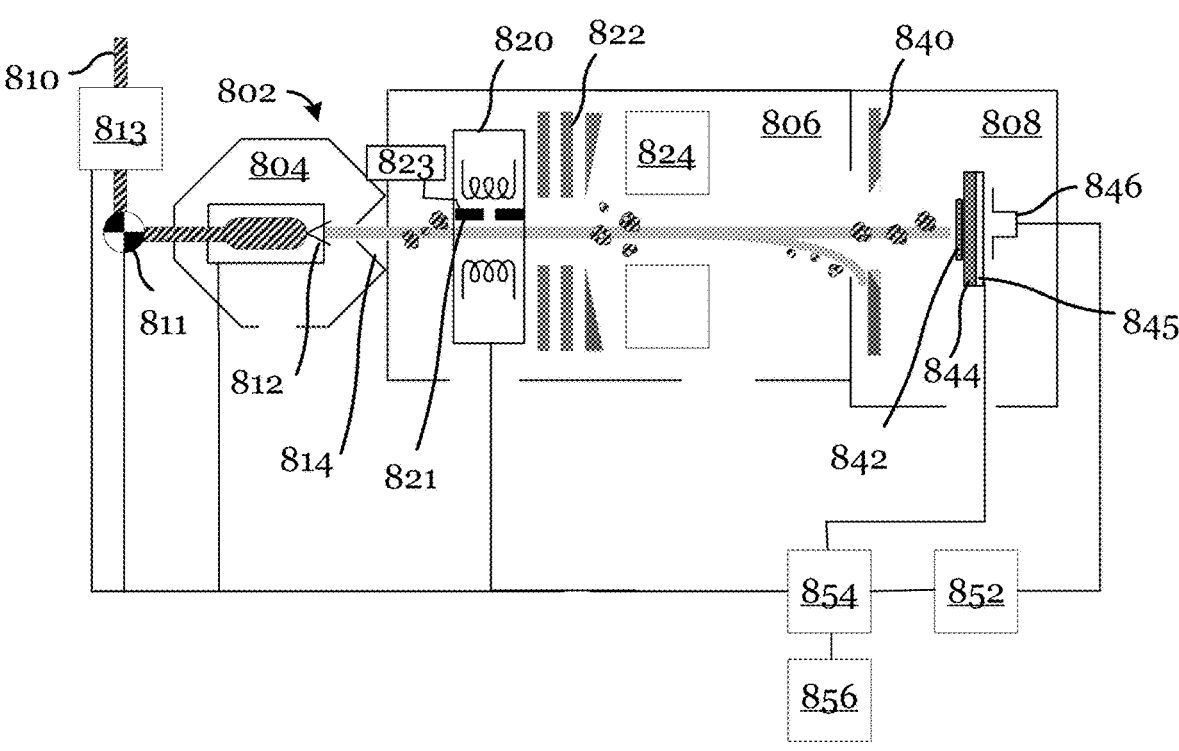
FIG. 8 illustrates a gas cluster ion beam (GCIB) processing system in accordance with an embodiment.

FIGS. 7A-7C illustrate process flow charts of methods of optical elements patterning in accordance with various embodiments. The process flow can be followed with the figures (FIGS. 1, 4A-4D and 5A-C) discussed above and hence will not be described again.

In FIG. 7A, a process flow 70 starts with etching a portion of a substrate in a GCIB process chamber to form a plurality of recesses by scanning the substrate comprising a patterned first mask layer over the substrate with a GCIB (block 710, FIGS. 4B-4C). While the scanning, a GCIB process parameter may dynamically be adjusted to tune the etching such that the plurality of recesses has a depth gradient across the portion of the substrate (block 720, FIGS. 4B-4C).

In FIG. 7B, another process flow 72 starts with forming a second mask layer over a patterned first mask layer of a substrate (block 702, FIG. 5A). Subsequently, the substrate may be scanned in a GCIB process chamber with a first GCIB to etch a portion of the second mask layer while tuning the etching such that a remaining surface of the second mask layer is slanted with an angle relative to a major surface of the substrate (block 706, FIG. 5B). After the scanning, a portion of the substrate may be etched to form a plurality of recess with a depth gradient in the portion of the substrate using the remaining second mask layer and the patterned first mask layer as an etch mask (block 712, FIG. 5C).

In FIG. 7C, yet another process flow 74 starts with selecting a first portion of a substrate for a first optical element to be formed that has an elongated shape (block 704, FIG. 1), followed by selecting a second portion of the substrate for a second optical element to be formed that has the elongated shape (block 708, FIG. 1), where the second portion is oriented in a direction different from that of the first portion. The substrate may then be scanned with a particle beam to form a first recess pattern with a first depth gradient on the first portion of the substrate and a second recess pattern with a second depth gradient on the second portion of the substrate (block 714, FIG. 1).

FIG. 8 illustrates a gas cluster ion beam (GCIB) processing system 800 in accordance with an embodiment.

Referring to FIG. 8, the main body of the GCIB processing system 800 may be housed in a vacuum vessel 802 comprising three communicating chambers, namely, a source chamber 804, an ionization/acceleration chamber 806, and a process chamber 808. The chambers may be evacuated to suitable operating pressures individually by vacuum pumping systems (not shown).

Gas clusters are formed in the source chamber 804. A source gas is introduced from a gas inlet 810 to the chamber 804 through a supersonic nozzle 812. A flow regulator 811 may regulate the flow of the gas through the gas inlet 810. A temperature controller 813 may be used to heat the gas to an appropriate temperature. Process parameters for gas cluster formation such as temperature, gas flow rates, and nozzle stagnation pressure may be controlled by the use of appropriate control systems (e.g., heaters and/or coolers, gas flow regulators, and pressure sensors) connected to the gas supply lines (not shown). In certain embodiments, the stagnation pressure may be between 70 to 500 kPa (525 Torr to 3.75×103 Torr). A skimmer aperture 814 is positioned downstream from the nozzle 812, and configured to partially deflect or skim a peripheral portion of the gas cluster jet. In certain embodiments, more than one nozzle may be configured in mutual close proximity in the source chamber 804, wherein the nozzles may be arranged to supply different gas mixtures to form a single GCIB. In certain embodiments, more than one skimmer may be used.

In the ionization/acceleration chamber 806, an ionizer 820 may be an electron ionization source comprising a metal filament, inductively coupled argon plasma source, or the like. The ionizer 820 may comprise an extraction plate 821, in which a voltage exerted for ionization may be measured, e.g., by a measurement circuit 823. Using the measurement circuit 823, a voltage response to an applied pulse at the ionizer, e.g., a drive pulse train may be measured.

In certain embodiments, the ionization may be performed with a voltage between 70 and 300 eV. In certain embodiments, the ionizer may further comprise a pulse generator to output a drive pulse train. In alternate embodiments, the pulse generator may be part of the control circuit of the system. In one embodiment, the ionizer 820 may be equipped with a LED drive power supply, a controller, a pulse width modulation (PWM) signal generator, and an extraction plate 821 that monitors the voltage extracted for ionization for the ion source (not shown). The use of a pulse train for driving the ionizer allows various process conditions. According to various embodiments of this disclosure, the duty ratio for a pulse train may take any value between 10 and 100%. The frequency of a pulse may be between 1 Hz and 10 kHz in one embodiment although in various embodiment the frequency of a pulse may have a different lower limit and/or upper limit. The operating state of the ionizer may be changed by toggling the LED drive power supply with the controller, and thereby causing the voltage change at the extraction plate 821.

An accelerator 822 may be a set of biased electrodes, and configured to provide a set amount of kinetic energy to the gas clusters. In certain embodiments, the acceleration voltage may be between 30 and 80 keV.

A beam filter 824 is positioned after the accelerator 822 and configured to remove a portion of the GCIB according to the size of clusters. In certain embodiments, the beam filter 824 may be a magnetic filter or Wien filter, a device comprising of orthogonal electric and magnetic fields that can be used as a velocity filter to select a range of cluster sizes. A portion of GCIB may be deflected by the filter 824 to another trajectory from the main beam direction, and removed by a defining aperture 840. The degree of deflection for a cluster depends on its mass, and thereby enabling size filtering. In certain embodiments, the GCIB processing system 800 may also include a neutralizer (not shown) to neutralize the charge in the beam before the beam striking the substrate 842.

In the process chamber 808, a substrate 842 is mounted on a substrate holder 844 adequately positioned in the beam-line, and the substrate holder 844 is connected to a scanner (not shown). The scanner may move the position of the substrate relative to the beam-line in any direction in the plane perpendicular to the beam line. The scanner may also have the ability to tilt the substrate and change the incident angle of the beam, which may be used to enable slanted gratings (e.g., FIGS. 6A-6B) in various embodiments.

The spot size of a GCIB may vary from a few microns to a few centimeters. The process chamber may be kept in a high vacuum, for example, the pressure of process chamber may be kept at or below 2.0×10–4 Pa (1.5×10-6 Torr).

A removable detector 846 may be positioned in the path of the GCIB, and configured to receive the GCIB and measure the beam current. In certain embodiments, the detector 846 is a Faraday cup or the like, which collects charges carried by the GCIB. In certain embodiments, the detector 846 may replace the substrate 842 and substrate holder 844 or just the substrate 842. In such embodiments, the detector 846 may be removed after completion of the calibration phase. In alternative embodiments, the detector 846 may be similar to the substrate, for example, a wafer to be processed.

In various embodiments, the charges may be measured by a current sensing system 852 connected to the detector 846

(or the substrate holder 844). The current sensing system 852 may be any suitable current sensing technique including transformer or coils based on induction, magnetic field based sensors, and other techniques. In one embodiment, the current sensing system 852 may be an oscilloscope with an analog front-end circuit. The current sensing system 852 may further be connected to a high-speed acquisition capable hardware comprising a processor 854 and a non-transitory memory 856 with a high write speed to store digital signals connected through a high speed bus.

In various embodiments, the processor 854 may be a part of a tool controller configured to receive information about the GCIB and send control signals to various units of the GCIB processing system 800, enabling a feedback control for GCIB processing. In certain embodiments, the tool controller may directly instruct one or more units of the GCIB system such as the control systems for a scanner 845, the nozzle 812 in the source chamber 804, the ionization/acceleration chamber 806, the flow regulator 811, and/or the temperature controller 813 to adjust one or more process parameters. Alternately, the tool controller may send control signals to another hardware controller circuit that controls the operation of the control systems for the units of the GCIB system.

Figure 9:
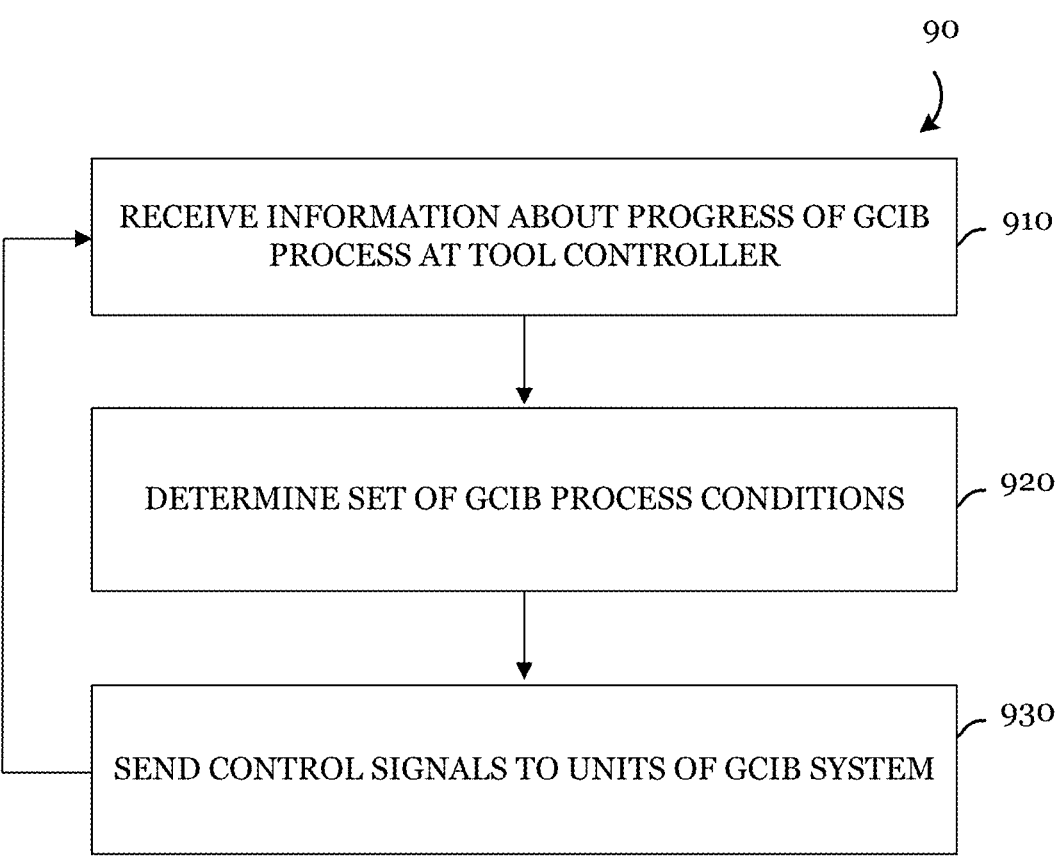
FIG. 9 illustrates an example feedback loop for dynamic control of a gas cluster ion beam (GCIB) in accordance with an embodiment.

FIG. 9 illustrates an example feedback loop 90 for dynamic control of a gas cluster ion beam (GCIB) in accordance with an embodiment.

As illustrated in FIG. 9, in accordance with an embodiment, the tool controller may receive information about the progress of a GCIB process (block 910). For example, the information may be about the precise X-Y location of the GCIB on the substrate during the GCIB process and received from the scanner or a metrology tool associated with determining the location of the substrate being processes relative to the scanner during the scanning process. Subsequently, based on this information (e.g., beam location), the tool controller may determine a set of GCIB process conditions (block 920). In various embodiments, the GCIB process conditions may be determined according to the target dose for the specific location to enable forming recesses with varying depth. The set of GCIB process conditions may comprise scanning speed, ionization level, and process gas flow among others. The tool controller may then send control signals to units of the GCIB system (block 930). As illustrated in FIG. 8, the units of the GCIB system may comprise the scanner 845, the nozzle 812 in the source chamber 804, the ionization/acceleration chamber 806, the flow regulator 811, and/or the temperature controller 813. In response to receiving the control signals, the unit receiving the control signals may change one or more parameters while scanning the GCIB. These steps (blocks 910, 920, and 930) may be repeated continuously during the GCIB process of the same substrate to enable location specific etching by the GCIB in various embodiments.

Example embodiments of the invention are summarized here. Other embodiments can also be understood from the entirety of the specification as well as the claims filed herein.

Example 1. A method for processing a substrate with a gas cluster ion beam (GCIB) that includes: receiving, at a GCIB controller, control signals from a tool controller to change a GCIB process parameter during a GCIB scanning process, the changing in the GCIB process parameter associated with a variation in the depth of recesses to be formed over the substrate with the GCIB scanning process; and performing the GCIB scanning process in a GCIB process chamber, the performing including scanning a GCIB across a portion of the substrate according to the control signals to form the recesses with varying depths, the variation in the depth of the recesses having a gradient associated with the change in the GCIB process parameter.

Example 2. The method of example 1, further including patterning a first mask layer disposed over the substrate, where forming the recesses by the GCIB scanning process is performed using the patterned first mask layer as an etch mask.

Example 3. The method of one of examples 1 or 2, further including, prior to the GCIB scanning process: forming a second mask layer over the substrate, the second mask layer covering the patterned first mask layer; etching a portion of the second mask layer by scanning the substrate with another GCIB such that a remaining surface of the portion of the second mask layer is slanted with a slope relative to a major surface of the substrate.

Example 4. The method of one of examples 1 to 3, further including, prior to the GCIB scanning process, tilting the substrate such that the GCIB impinges on the substrate with an angle relative to a plane normal to a major surface of the substrate and the recesses is slanted with an angle relative to the plane normal to the major surface of the substrate.

Example 5. The method of one of examples 1 to 4, where the angle is between 15° and 65°.

Example 6. The method of one of examples 1 to 5, where the recesses are arranged in a matrix on a major surface of the substrate, and where the variation in the depth of the recesses has a first gradient in a first direction on the major surface and a second gradient in a second direction on the major surface, the second direction being normal to the first direction.

Example 7. The method of one of examples 1 to 6, where the GCIB process parameter includes a scanning speed.

Example 8. The method of one of examples 1 to 7, further including, after etching the portion of the substrate, performing another GCIB process to smoothen a top surface of the substrate.

Example 9. A method for processing a substrate with a gas cluster ion beam (GCIB) that includes: patterning a first mask layer disposed over the substrate; forming a second mask layer over the patterned first mask layer of the substrate; and etching a portion of the second mask layer such that a remaining surface of the portion of the second mask layer is slanted with a slope relative to a major surface of the substrate, the etching including, receiving, at a GCIB controller, control signals from a tool controller to change a GCIB process parameter during etching the portion of the second mask layer, the changing in the GCIB process parameter associated with the slope, and scanning a first GCIB across a portion of the substrate according to the control signals.

Example 10. The method of example 9, where the patterned first mask layer has a recess pattern including a plurality of recesses with an equal depth.

Example 11. The method of one of examples 9 or 10, further including, prior to the scanning, tilting the substrate such that the first GCIB impinges on the substrate with an angle relative to a plane normal to the major surface of the substrate.

Example 12. The method of one of examples 9 to 11, further including, after etching the portion of the second mask layer, etching a portion of the substrate to form recesses with varying depth in the portion of the substrate using the remaining second mask layer and the patterned first mask layer as an etch mask, where the variation in the depth of the recesses is associated with a variation in the thickness of the etch mask.

Example 13. The method of one of examples 9 to 12, where etching the portion of the substrate includes exposing the substrate to a plasma in a plasma process chamber.

Example 14. The method of one of examples 9 to 13, where etching the portion of the substrate includes scanning the substrate with a second GCIB in the GCIB process chamber.

Example 15. The method of one of examples 9 to 14, where the recesses are arranged in a matrix on a major surface of the substrate, and where the variation in the depth of the recesses has a first gradient in a first direction on the major surface and a second gradient in a second direction on the major surface, the second direction being normal to the first direction.

Example 16. A method of fabricating a plurality of optical elements from a substrate that includes: selecting a first portion of the substrate for a first optical element to be formed that has an elongated shape along a first direction; selecting a second portion of the substrate for a second optical element to be formed that has the elongated shape along a second direction different from the first direction; and scanning the substrate with a particle beam to form a first recess pattern with varying depth on the first portion of the substrate and a second recess pattern with varying depth on the second portion of the substrate.

Example 17. The method of example 16, further including, prior to scanning the substrate, forming a first patterned mask layer having an uniform thickness over the substrate, where the pattern of the first patterned mask layer is associated with the first and second recess patterns.

Example 18. The method of one of examples 16 or 17, where scanning the substrate includes exposing the substrate to a gas cluster ion beam (GCIB) to etch the substrate using the first patterned mask layer as an etch mask to form the first recess pattern and the second recess pattern.

Example 19. The method of one of examples 16 to 18, further including, prior to scanning the substrate, forming a second mask layer over the first patterned mask layer, and where scanning the substrate includes exposing the substrate to a gas cluster ion beam (GCIB) to etch a portion of the second mask layer such that a remaining surface of the second mask layer is slanted with a slope relative to a major surface of the substrate.

Example 20. The method of one of examples 16 to 19, further including, after scanning the substrate, performing an etch process to etch the first and second portions of the substrate using the remaining second mask layer and the patterned first mask layer as an etch mask.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate with a gas cluster ion beam (GCIB), the method comprising:
receiving, at a GCIB controller, control signals from a tool controller to change a GCIB process parameter during a GCIB scanning process, the change in the GCIB process parameter providing location-specific variations in etching by a GCIB; and
performing the GCIB scanning process in a GCIB process chamber, the performing comprising scanning the GCIB across a portion of the substrate according to the control signals to form recesses with varying depths in the substrate, the variation in the depths of the recesses having a gradient associated with the location-specific variations in etching by the GCIB.

2. The method of claim 1, further comprising patterning a first mask layer disposed over the substrate, wherein forming the recesses by the GCIB scanning process is performed using the patterned first mask layer as an etch mask.

3. The method of claim 2, further comprising, prior to the GCIB scanning process:
forming a second mask layer over the substrate, the second mask layer covering the patterned first mask layer; and
etching a portion of the second mask layer by scanning the substrate with another GCIB such that a remaining surface of the portion of the second mask layer is slanted with a slope relative to a major surface of the substrate.

4. The method of claim 1, further comprising, prior to the GCIB scanning process, tilting the substrate such that the GCIB impinges on the substrate at an angle relative to a plane normal to a major surface of the substrate and the recesses are slanted with the angle relative to the plane normal to the major surface of the substrate.

5. The method of claim 4, wherein the angle is between 15° and 65°.

6. The method of claim 1, wherein the recesses are arranged in a matrix on a major surface of the substrate, and wherein the variation in the depths of the recesses has a first gradient in a first direction on the major surface and a second gradient in a second direction on the major surface, the second direction being normal to the first direction.

7. The method of claim 1, wherein the GCIB process parameter comprises a scanning speed or a spot size.

8. The method of claim 1, further comprising, after etching the portion of the substrate, performing another GCIB process to smoothen a top surface of the substrate.

9. A method for processing a substrate with a gas cluster ion beam (GCIB), the method comprising:
patterning a first mask layer disposed over the substrate;
forming a second mask layer over the patterned first mask layer of the substrate; and
etching a portion of the second mask layer such that a remaining surface of the portion of the second mask layer is slanted with a slope relative to a major surface of the substrate, the etching comprising:
receiving, at a GCIB controller, first control signals from a tool controller to change a GCIB process parameter during the etching, the change in the GCIB process parameter providing first location-specific variations in etching by a first GCIB;
scanning the first GCIB across a portion of the substrate according to the first control signals to form the slope of the remaining surface of the portion of the second mask layer;
receiving, at the GCIB controller, second control signals from the tool controller to adjust the GCIB process parameter during the etching, the adjusting providing second location-specific variations in etching by a second GCIB, the second location-specific variations being different from the first location-specific variations; and
scanning the second GCIB across the portion of the substrate according to the second control signals.

10. The method of claim 9, wherein the patterned first mask layer has a recess pattern comprising a plurality of recesses with an equal depth.

11. The method of claim 9, further comprising:

prior to scanning the first GCIB, tilting the substrate such that the first GCIB impinges on the substrate with an angle relative to a plane normal to the major surface of the substrate.

12. The method of claim 9, further comprising:

after etching the portion of the second mask layer, etching a portion of the substrate using the remaining second mask layer and the patterned first mask layer as an etch mask to form recesses with varying depths in the portion of the substrate, wherein the variation in the depths of the recesses is associated with a variation in a thickness of the etch mask.

13. The method of claim 12, wherein etching the portion of the substrate comprises exposing the substrate to a plasma in a plasma process chamber.

14. The method of claim 12, wherein the second GCIB is scanned with a faster scan rate or a larger spot size compared to the first GCIB.

15. The method of claim 12, wherein the recesses are arranged in a matrix on a major surface of the substrate, and wherein the variation in the depths of the recesses has a first gradient in a first direction on the major surface and a second gradient in a second direction on the major surface, the second direction being normal to the first direction.

16. A method of fabricating a plurality of optical elements from a substrate, the method comprising:

selecting a first portion of the substrate for a first optical element to be formed that has an elongated shape along a first direction;

selecting a second portion of the substrate for a second optical element to be formed that has the elongated shape along a second direction different from the first direction; and etching the substrate with a particle beam to form a first recess pattern with varying depth on the first portion of the substrate and a second recess pattern with varying depth on the second portion of the substrate, wherein etching the substrate with the particle beam comprises scanning the particle beam over the substrate while changing a particle beam process parameter to provide location-specific variations in etching by the particle beam.

17. The method of claim 16, further comprising, prior to scanning the substrate, forming a first patterned mask layer having a uniform thickness over the substrate, wherein the pattern of the first patterned mask layer is associated with the first and second recess patterns.

18. The method of claim 17, wherein scanning the substrate comprises exposing the substrate to a gas cluster ion beam (GCIB) to etch the substrate using the first patterned mask layer as an etch mask to form the first recess pattern and the second recess pattern.

19. The method of claim 17, further comprising, prior to scanning the substrate, forming a second mask layer over the first patterned mask layer, and wherein scanning the substrate comprises exposing the substrate to a gas cluster ion beam (GCIB) to etch a portion of the second mask layer such that a remaining surface of the second mask layer is slanted with a slope relative to a major surface of the substrate.

20. The method of claim 19, further comprising, after scanning the substrate, performing an etch process to etch the first and second portions of the substrate using the remaining second mask layer and the first patterned mask layer as an etch mask.

*    *    *    *    *